United States Patent [19]

Clark et al.

[11] 4,058,773
[45] Nov. 15, 1977

[54] ASYNCHRONOUS SELF TIMED QUEUE

[75] Inventors: Becky J. Clark, La Jolla; Charles L. Seitz, Palo Alto, both of Calif.

[73] Assignee: Burroughs Corporation, Detroit, Mich.

[21] Appl. No.: 666,609

[22] Filed: Mar. 15, 1976

[51] Int. Cl.² .................. G11C 19/00; G11C 19/28
[52] U.S. Cl. .................. 328/37; 235/92 SH; 307/221 R; 307/224 R; 307/238; 340/168 S
[58] Field of Search ............... 302/221 R, 224 R, 238, 302/223 R; 328/37; 340/168 S, 173 FF; 235/92 SH

[56] References Cited

U.S. PATENT DOCUMENTS

| | | | |
|---|---|---|---|
| 3,166,715 | 1/1965 | Cogar | 328/37 |
| 3,212,009 | 10/1965 | Parker | 328/37 |
| 3,300,724 | 1/1967 | Cutaia | 328/37 |
| 3,838,345 | 9/1974 | Schneider | 328/37 |

*Primary Examiner*—John Zazworsky
*Attorney, Agent, or Firm*—G. Gregory Schivley; Mervyn L. Young; Kevin R. Peterson

[57] ABSTRACT

An asynchronous system includes a plurality of cascaded asynchronous cells in which data is transferred through the system according to the presence of data in the cells. Each cell contains two latches for storing binary data. Means are provided for feeding back to the previous cell a signal indicative of data stored in either of the latches. Transfer gate means cooperating with the latches and the feedback data presence signal provides a means by which data is sequentially transferred through the queue according to the presence or absence of data in the cells.

6 Claims, 11 Drawing Figures

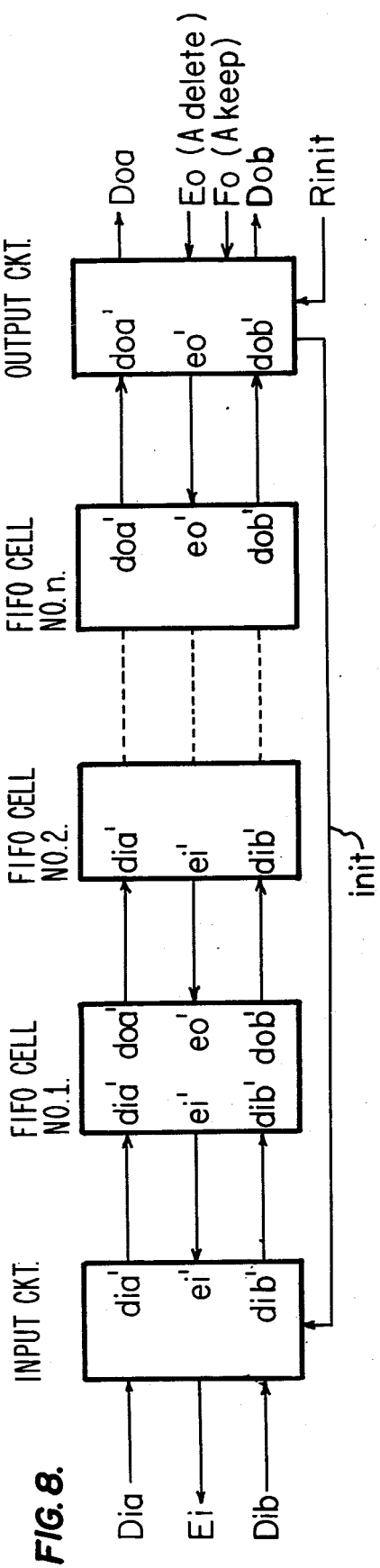
FIG. 8.
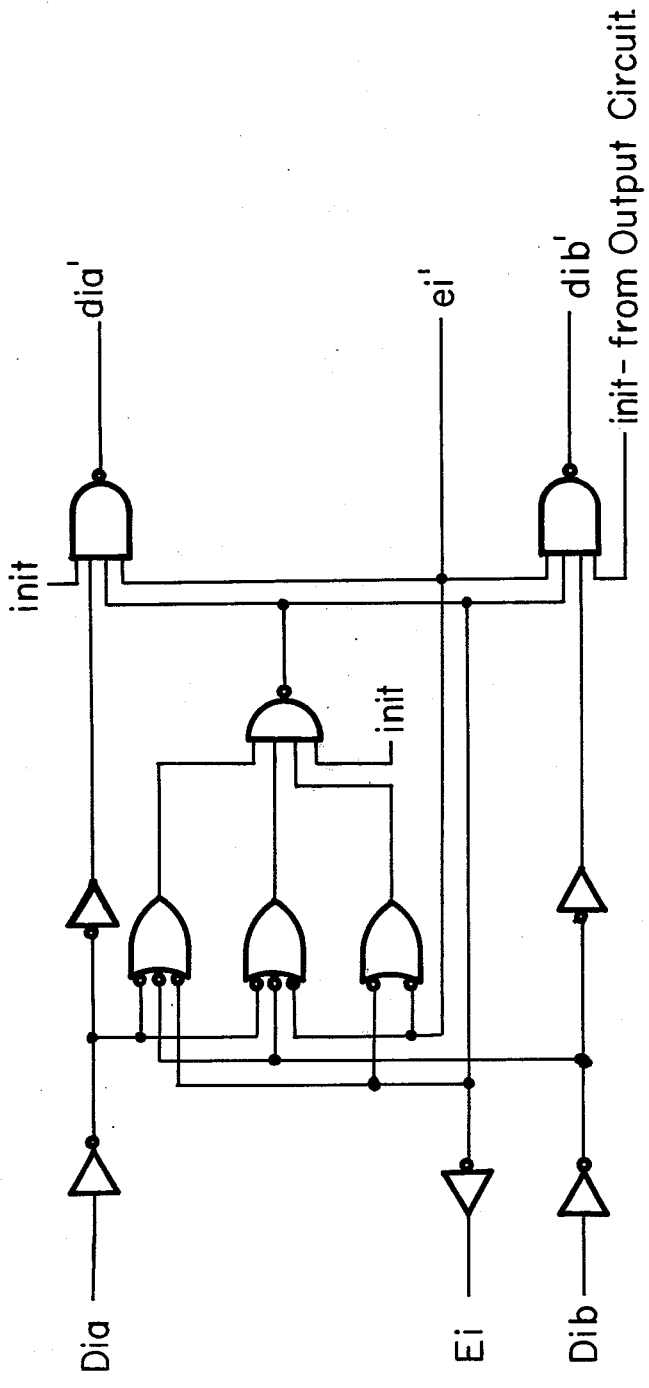
FIG. 9. INPUT CIRCUIT:

FIFO CELL

OUTPUT CIRCUIT

ASYNCHRONOUS SELF TIMED QUEUE

BACKGROUND OF THE INVENTION

The present invention relates generally to asynchronous circuits. More particularly, this invention involves a plurality of cascaded asynchronous cells forming a queue for high speed transfer of data completely independent of timing or clock sources.

Since the introduction of the present day computer and data processing system, considerable development has been made towards providing faster computing devices. Increases in speed of overall operation have heretofore come primarily from increases in the speed of operation of the relative parts and components of the data processing system or computer. However, asynchronous circuits and systems have been the subject of considerable investigation in recent years due to both the increase in speed of operation which can be achieved and other properties of such circuits. Asynchronous circuits are distinguished from synchronous circuits in that the latter operates on a distinct time cycle wherein transfer of each particular bit of information is restricted to a preselected and well-defined time period or clock cycle. In contrast, data transfer in an asynchronous system is not dependent upon a timing or clock source. One such asynchronous system is disclosed in U.S. Pat. No. 3,757,231 Faustini. The form of storage used in his cell and the separation of the shift control logic from the data storage, however, have their drawbacks. For example, the use of separate control logic requires more gates and results in a slower transfer rate.

Other asynchronous systems have been disclosed in the literature. However, each system has its own peculiar mode of data representation, transfer, and storage. In general, these other systems have differed in function from the present invention and/or have not provided optimum speed for data transfer.

OBJECTS AND SUMMARY OF THE INVENTION

Therefore, it is a general object of the present invention to provide an asynchronous system which is driven by the presence or absence of data in each cell rather than by external timing or separate control logic.

It is an object of this invention to provide an asynchronous queue which can operate over a wide range of input and output data transfer rates.

It is an object of this invention to provide an asynchronous queue having a high data transfer rate capability.

It is a further object of this invention to provide an asynchronous queue which has a minimum number of gates and which can be readily implemented in integrated circuit form.

Briefly stated, the present invention provides an asynchronous data transfer system having a plurality of cascaded asynchronous cells. Each cell contains two latches for storing binary data. A data presence gate for each cell provides a feedback signal to the previous cell which is indicative of data stored in either of the latches. Transfer gates for each of the latches transfer the stored data to subsequent cells upon receiving a signal from the next cell denoting that the cell is empty and capable of receiving new data. Data transfer is thus controlled merely by the presence or absence of data in each of the cells. Input and output circuits are also provided to interface the cells with external circuitry regardless of the speed of operation therein.

BRIEF DESCRIPTION OF THE DRAWINGS

Other objects and advantages of the invention will become apparent upon reading the following detailed description and upon reference to the drawings, in which:

FIG. 8 is a block diagram showing another embodiment of the asynchronous system of the present invention;

FIG. 9 is a schematic diagram showing one embodiment of an input circuit which can be utilized in the system shown in FIG. 8;

DETAILED DESCRIPTION OF THE INVENTION

The operation of the asynchronous system of this invention will be described by way of reference to FIGS. 1-7 which show implementation of the system with OR/NOR gates. The use of the OR/NOR gates lends itself to integration into a bipolar device utilizing the ECL (emitter coupled logic) type logic. However, it should be understood that this invention can be implemented utilizing other types of gates. For example, implementation with NAND gates is shown in FIGS. 8-11 which is particularly useful for I²L integration.

Figure 1:
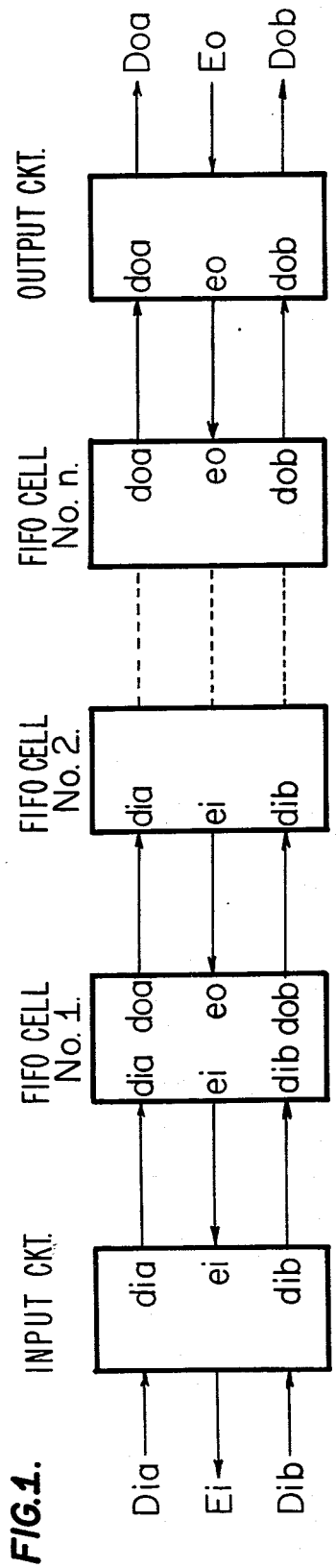
FIG. 1 is a block diagram showing one embodiment of the asynchronous system of the present invention.

Turning then to FIG. 1, there is shown a block diagram of one embodiment of the asynchronous system of the present invention. This system includes a plurality of cascaded internal cells numbered 1 through $n$. Each cell includes two data input lines $dia$ and $dib$ for receiving a double-rail data input. Each cell includes a feedback data presence signal $ei$ for supplying a signal to the previous cell which is indicative of the state of the cell. The feedback signal $ei$ of the next cell is coupled to an input line $eo$ of the present cell which, in turn, controls the transfer of data to the next cell via $doa$ and $dob$. An Input Circuit is provided to interface between an external data source and the internal cells of the queue. Data from an external circuit is entered on input lines $Dia$ and $Dib$. The data is shifted sequentially from the Input Circuit through the cells numbered 1 through $n$. The contents of the queue may be read by external circuitry through the Output Circuit. The Input Circuit provides a feedback signal $Ei$ to the external data source to indicate whether the queue is capable of receiving new data, i.e., whether Cell No. 1 is empty. Similarly, the Output Circuit includes an input for receiving an acknowledge signal E$o$ from the external circuitry in order to regulate the reading of data from the queue.

In general operation of the embodiment of the asynchronous system shown in FIG. 1, data from external circuitry is entered into the queue using a double-railed approach via input lines D$ia$ and D$ib$. If no data is present, there will be logical zeros on both D$ia$ and D$ib$. If there is a logical one entered at D$ia$, then a logical zero will be present at D$ib$. If a logical one is present on D$ib$, then D$ia$ will be logically zero. In such manner, the upper rail can be arbitrarily assigned to represent a value of logical one for one bit of data whereas the lower rail will represent a logical zero state. Using this convention, if a logical one is to be stored in the queue, a logical one signal will be entered through D$ia$. In contrast, if the data to be stored is a logical zero, then the logical one will be entered at D$ib$. The information is then sequentially transferred through the empty cells in the queue until all remaining cells are filled with data. That is, if one cell senses that the next cell is already filled with data, the data will remain stored in that cell. The data stored in the queue can then be read out through the Output Circuit on a first in first out (FIFO) basis.

Figure 2:
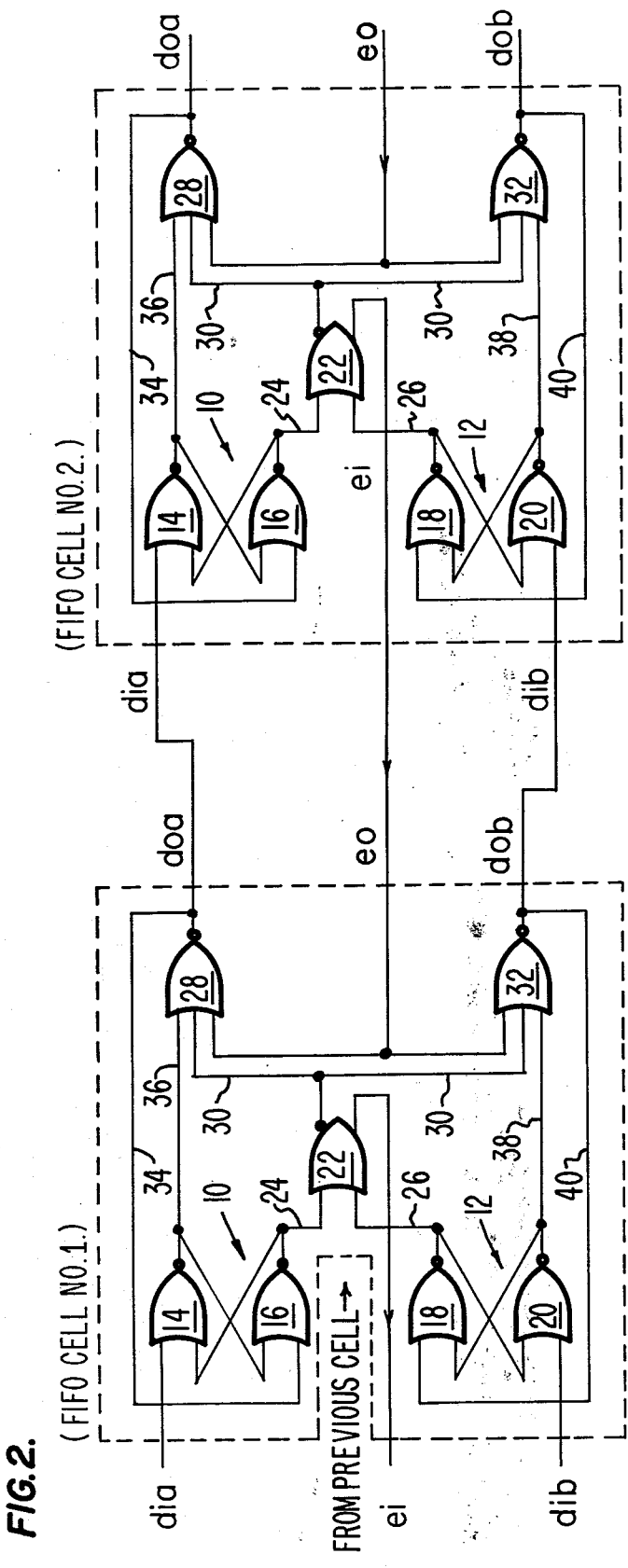
FIG. 2 is a schematic diagram showing one embodiment of two cascaded cells of the present invention.

Referring now to FIG. 2, each cell includes two latches 10 and 12, one each for each data input line $dia$ and $dib$, respectively. Latch 10 is comprised of two cross coupled NOR gates 14 and 16. Latch 12 similarly includes NOR gates 18 and 20. The output of gate 16 is coupled to one input of data presence gate 22 via line 24. The output of gate 18 of latch 12 is coupled to the other input of gate 22 by line 26. Presence gate 22 includes a negated or NOR output which is coupled to one input of NOR transfer gate 28 via line 30. The other non-negated or OR output of gate 22 provides a feedback signal $ei$ to the previous cell which is indicative of whether or not data is stored in the latches of the cell. The output of transfer gate 28 is coupled to one input of gate 16 of latch 10 via line 34. Line 36 couples the output of gate 14 to one input of gate 28. The remaining input of gate 28 is coupled to $eo$ which is coupled to the feedback signal $ei$ of Cell No. 2. Similar to gate 28, transfer gate 32 is a multiple input NOR gate having $eo$ as one input, line 30 as one input and line 38 as the other input which connects with the output of gate 20. The output of transfer gate 32 is coupled to the input of gate 18 via line 40.

In the initial state (i.e., no data input at $dia$ or $dib$), $ei$ of Cell No. 1 will be at a zero level since no data is being stored in latches 10 and 12. All inputs to gates 14 and 20 are initially zero, causing logical ones on lines 36 and 38 and logical zeros on the outputs of transfer gates 28 and 32. Consequently, one input to each of the gates 16 and 18 is at a logical one with the outputs on lines 24 and 26, respectively, at logical zero. Accordingly, the non-negated output $ei$ of data presence gate 22 will be at a zero level, indicating that the cell is empty.

Assume now that a logical one is to be entered at $dia$. Line 26 from latch 12 will remain at a logical zero since no change has occurred. However, line 24 of latch 10 will go to a logical one since the output of gate 14 becomes a logical zero. This causes $ei$ to go to a logical one level signaling that data has been entered and that Cell No. 1 is full. Accordingly, it will prevent new data from being entered at $dia$ or $dib$. With line 24 at a logical one and line 26 at a logical zero, the negated output of presence gate 22 goes to a logical zero. Assuming that Cell No. 2 is empty and $eo$ is at a logical zero, all of the inputs to transfer gate 28 will then be at a logical zero. Consequently, the output $doa$ of Cell No. 1 changes to a logical one, representing the logical one that was entered at $dia$. Line 34 is then at a logical one with the other input to gate 16 at a logical zero. Accordingly, line 24 returns to a logical zero and $ei$ also returns to a logical zero indicating that the data has been transferred and that Cell No. 1 is empty again and ready to receive new information. The data having been transferred through gate 28, the transfer gate 28 is reset via line 30 or line 36 to a zero level on the output.

Cell No. 2 will store the data at least temporarily in latch 10. While the data is stored in latch 10, $ei$ of Cell No. 2 will provide a logical one output which prevents Cell No. 1 from transferring any new data by placing a logical one at one of the inputs to each of the transfer gates 28 and 32. If Cell No. 3 is empty, Cell No. 2 will similarly transfer the data to it. Then $ei$ of Cell No. 2 will return to a logical zero, thus indicating that it is empty and is capable of receiving new data from Cell No. 1. On the other hand, if Cell No. 2 cannot transfer data to the next cell, $ei$ will remain at a logical one thereby preventing data transfer. Thus it can be seen that data will be transferred sequentially from cell to cell as long as there are empty cells in the queue.

Figure 3:
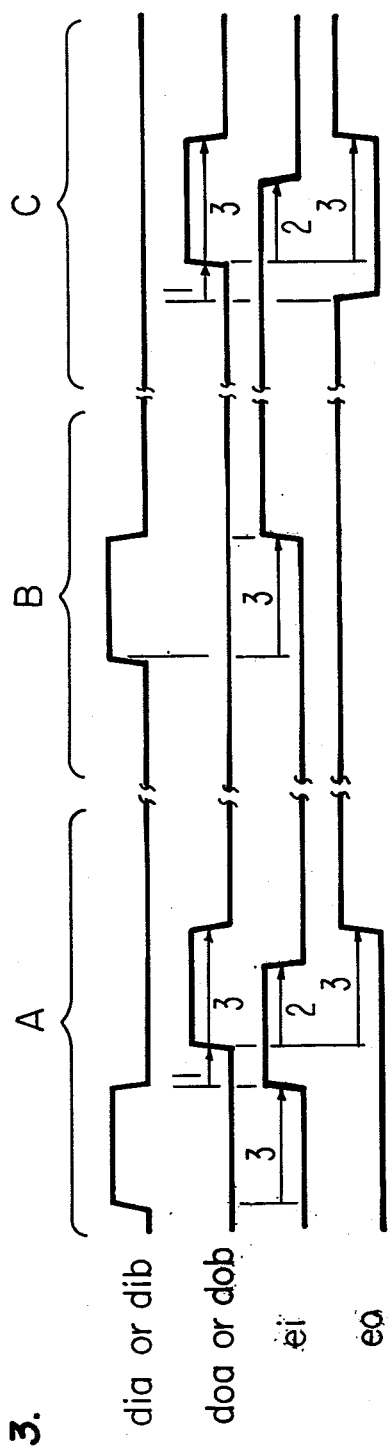
FIG. 3 is a timing diagram showing data transfer through the cascaded cells shown in FIG. 2.

FIG. 3 shows a timing diagram of the operation of the cells shown in FIG. 2. Section A represents data passing through a cell and being stored in the next cell. Section B represents another bit of data being stored in the cell when the next cell is already occupied. Section C represents data being passed along when the next cell becomes available. These diagrams show the timing relationships of signals on several of the lines within a cell during normal operation. The gate delays indicate the approximate times between the occurrences of different signals. For the circuit to operate properly, relationships between the delays through different gates must be satisfied. If the minimum delay of a signal through any three gates is always greater than the maximum delay of a signal through any two gates, the circuit will operate properly. These requirements must be made because of the feedback paths within each cell and between adjacent cells.

Figure 4:
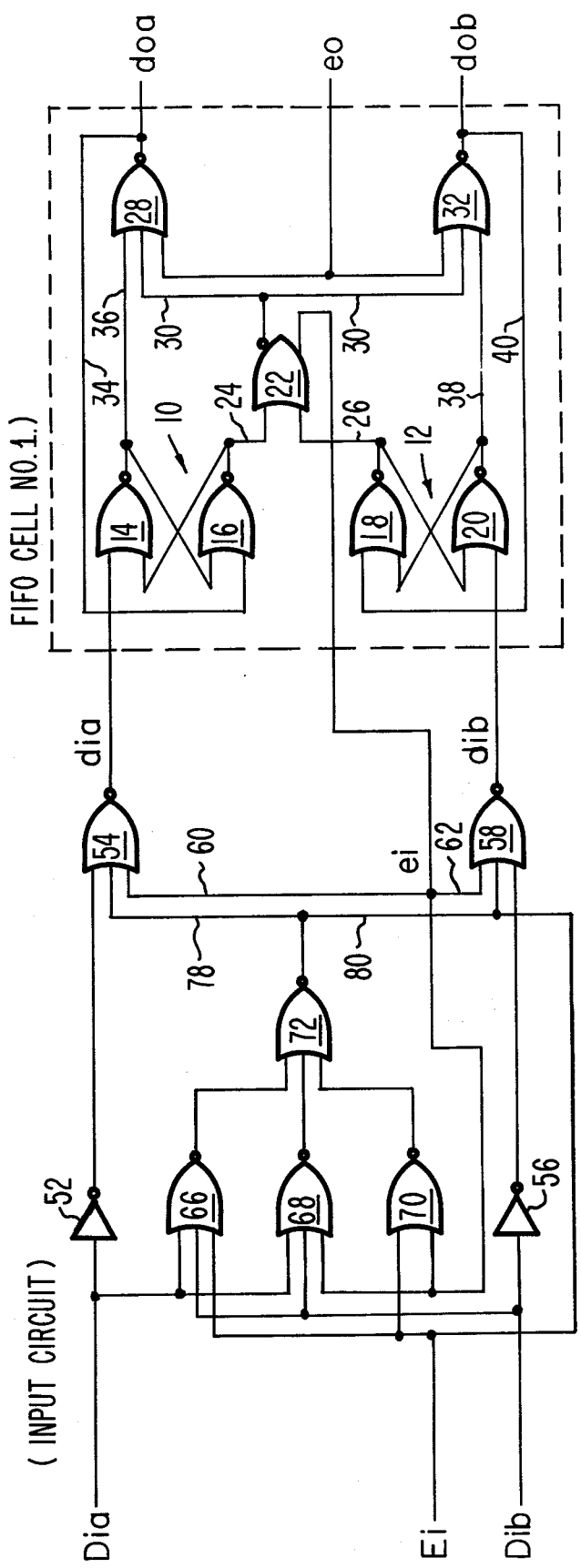
FIG. 4 is a schematic diagram showing one embodiment of an input circuit coupled to the first cell of the asynchronous system of this invention shown in FIG. 2.

Referring now to FIG. 4, the operation of the Input Circuit will be explained in cooperation with the first cell, Cell No. 1. The Input Circuit includes two data lines D$ia$ and D$ib$ for transferring data from an external data source into the cells. Data line D$ia$ is coupled to the input of an inverter 52 which, in turn, is coupled to a NOR transfer gate 54. Similarly, data line D$ib$ is coupled to an inverter 56 which, in turn, is coupled to a NOR transfer gate 58. The feedback signal $ei$ from Cell No. 1 is coupled via lines 60 and 62 to the inputs of transfer gates 54 and 58, respectively. Data line D$ia$, data line D$ib$, and feedback signal E$i$ are coupled to the input of gate 66. Data line D$ia$, data line D$ib$, and feedback signal $ei$ from Cell No. 1 are coupled to the input of gate 68. The feedback signal E$i$ for the Input Circuit and the feedback signal $ei$ for the cell are coupled to the input of gate 70. The outputs of gate 66, 68 and 70 are coupled to the inputs of gate 72. The output of gate 72 is coupled to the inputs of transfer gates 54 and 58 via lines 78 and 80, respectively. The output of gate 72 is also coupled to the feedback control signal E$i$ for the Input Circuit via line 80.

The Input Circuit provides an interfacing arrangement by which data can be entered into the cells from external logic. The input logic may be implemented from gates as fast as or faster than those in the internal cells of the asynchronous queue. Since the Input Circuit does not have any latches to store the data, the input lines must be held at their respective data levels until a signal via $ei$ is received thereby acknowledging the fact that the first inner cell has received the input data. Assuming that the data input lines D$ia$ and D$ib$ are initially at zero and further that the Cell No. 1 is not full, the output from gate 72 is zero, causing E$i$ to be zero. A logical zero level on E$i$ indicates that the Input Circuit can receive data. When data is delivered to D$ia$ or D$ib$, transfer gate 54 or 58 goes to a logical one level and transfers data to Cell No. 1 via line $dia$ or $dib$. These levels are held until a logical one level is received from feedback signal $ei$ of Cell No. 1, thus indicating that the cell has received the data and that the data is set into the appropriate latch in the cell. When feedback signal $ei$ changes to a logical one level, the transfer gate 54 or 58 returns to a logical zero level, gate 70 changes to zero, and the gate 72 output, E$i$, changes to a logical one level blocking further information transfer into the Input Circuit. Consequently, at any time that the first cell is not capable of receiving data, the feedback control signal E$i$ will be at a logical one level. However, as soon as the first cell is empty and the input lines D$ia$ and D$ib$ are both zero, E$i$ will return to a logical zero level thereby permitting transfer of data into the cell.

It should be noted that the input lines D$ia$ or D$ib$ and the output line E$i$ of the Input Circuit follow a convention involving four phases of a cycle. Initially the Input Circuit is dormant with D$ia$, D$ib$, and E$i$ at logical zero. Either D$ia$ or D$ib$ may then go to logical one, indicating that input data is present. After some delay E$i$ will change to logical one, indicating that the input data has been stored in the first cell. The input data will then be taken away by setting both D$ia$ and D$ib$ to logical zero, after which E$i$ returns to logical zero. The use of this convention insures the validity of the input data without placing other timing constraints upon the circuit and eliminates any need for other external timing signals.

Figure 5:
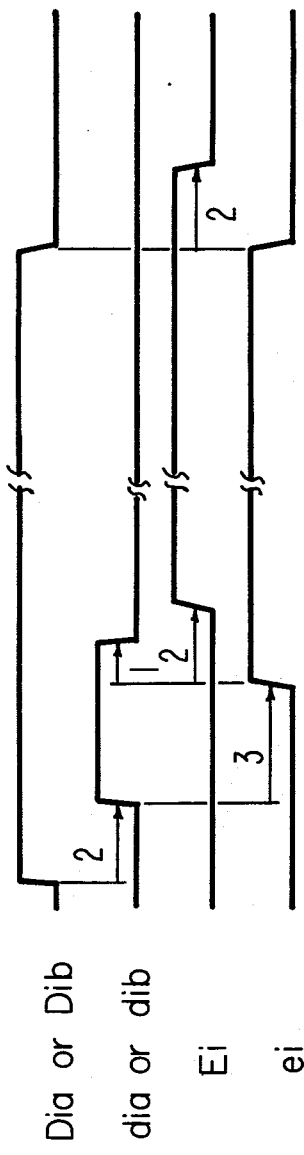
FIG. 5 is a timing diagram of the data transfer from the input circuit to the first cell shown in FIG. 4.

FIG. 5 shows a timing diagram of the operation of data transfer from the Input Circuit to the first cell in the queue with the approximate number of gate delays between transitions indicated. The first section shows the operation of the Input Circuit as input data arrives on D$ia$ or D$ib$ and is passed to the first internal cell. The second section shows operation as the input data is taken away.

Figure 6:
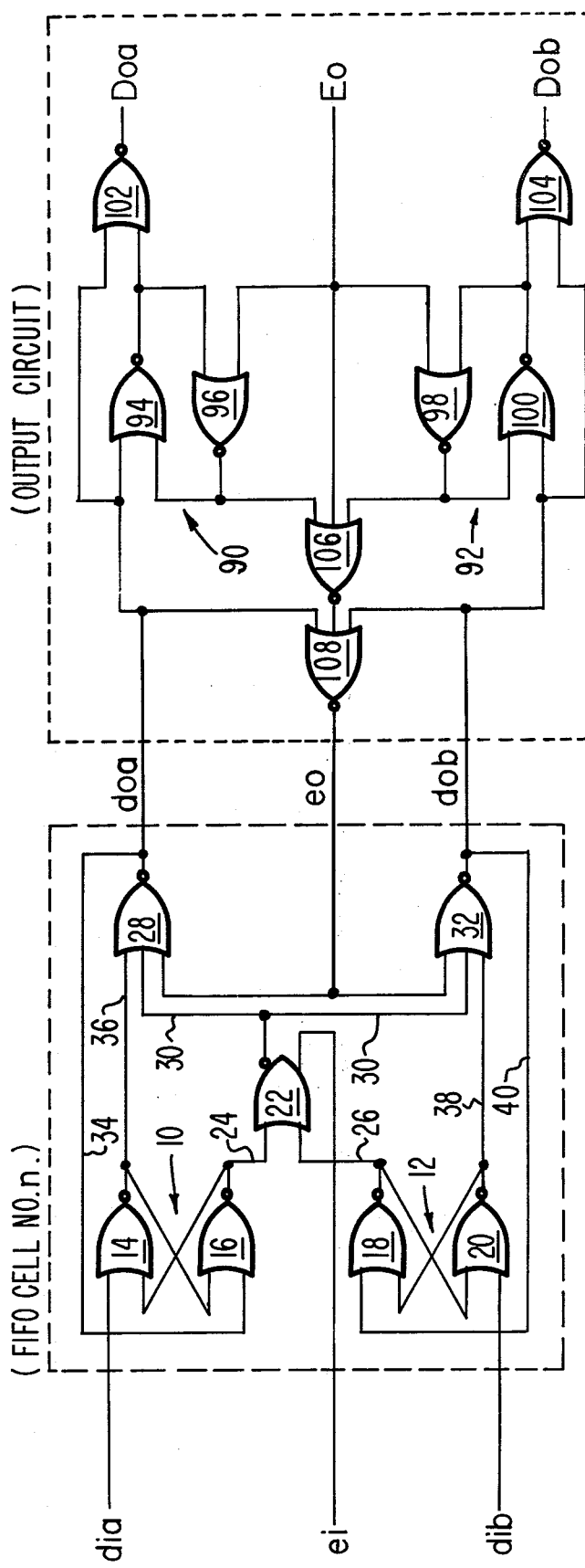
FIG. 6 is a schematic diagram of an output circuit embodied in this invention which is coupled to the last cell in the system.

Referring now to FIG. 6, the cooperation between the last of the inner cells of the queue with the Output Circuit will now be explained. FIG. 6 shows the last internal cell, designated as Cell No. $n$, of the queue. The Output Circuit cooperates with Cell No. $n$ to permit data to be read out of the queue by external circuitry. Similar to the Input Circuit, it can be implemented out of gates as fast as or faster than those of the internal cells. The Output Circuit includes two latches 90 and 92 coupled to the cell output lines $doa$ and $dob$, respectively. Latch 90 includes cross coupled NOR gates 94 and 96. Similarly, latch 92 includes NOR gates 98 and 100. The output of gate 94 is coupled to one input of transfer gate 102. The other input of transfer gate 102 is coupled to the data input line $doa$. Similarly, gate 100 of latch 92 is coupled to one input of transfer gate 104. The other input of gate 104 is coupled to the data input line $dob$. The outputs of gates 96 and 98 are coupled to the input of feedback gate 106. The other input of gate 106 is connected to line E$o$ representing an acknowledge signal from the external circuitry. E$o$ is also coupled to the inputs of gates 96 and 98. The data input lines $doa$ and $dob$ and the output of gate 106 are coupled to the inputs of gate 108 which provides an output $eo$.

In operation, assume initial conditions in which $eo$ and E$o$ are at a logical zero level indicating that there is no data stored in either of the latches 90 or 92 with gates 96 and 98 at logical zero and further that the external circuit is capable of reading data from the queue. If a logical one appears on data line $doa$, then latch 90 is set with a logical one at the output of gate 96. The logical one input to feedback gate 106 provides a logical zero output, but the logical one on $doa$ keeps $eo$ at logical zero until $doa$ changes to zero. The data line $doa$ will return to zero after the output of gate 16 in the cell changes to a zero due to the logical one input via line 34. The zero on line 24 changes the output 30 of data presence gate 22 to a one level which resets transfer gate 28 thereby returning $doa$ to a logical zero. When the zero at the output of transfer gate 28 returns $doa$ to a logical zero level, both inputs to transfer gate 102 are then at a logical zero level thereby setting a logical one at D$oa$ and transferring the data to the external circuit. It is important to noted that the data is not transferred to the external circuit until the previous cell, here Cell No. $n$, is cleared. Consequently, this interconnection prevents any new information from being transferred until the original data has been read from the Output Circuit.

After the external circuit has read the data from the Output Circuit, it will acknowledge data transfer by providing a logical one at E$o$. The logical one at E$o$ clears the latch 90 by returning the output of gate 96 to a zero level and thus changing the output of gate 94 to a logical one level. This in turn clears transfer gate 102 and returns it to a logical zero level. When E$o$ returns to a logical zero level thereby signaling that the external circuit is again capable of reading new data, gate 106 changes to logical one and $eo$ to logical zero. The Output Circuit is then in its initial state, and new data may be received. The analogous sequence of events occurs if a logical one appears at $dob$ instead of $doa$ as explained above.

It may be seen that the signals D$oa$, D$ob$, and E$o$ of the Output Circuit follow the same four-phase convention as described for the signals D$ia$, D$ib$, and E$i$, respectively, of the Input Circuit. The use of this convention allows the asynchronous queues to be cascaded in series.

Figure 7:
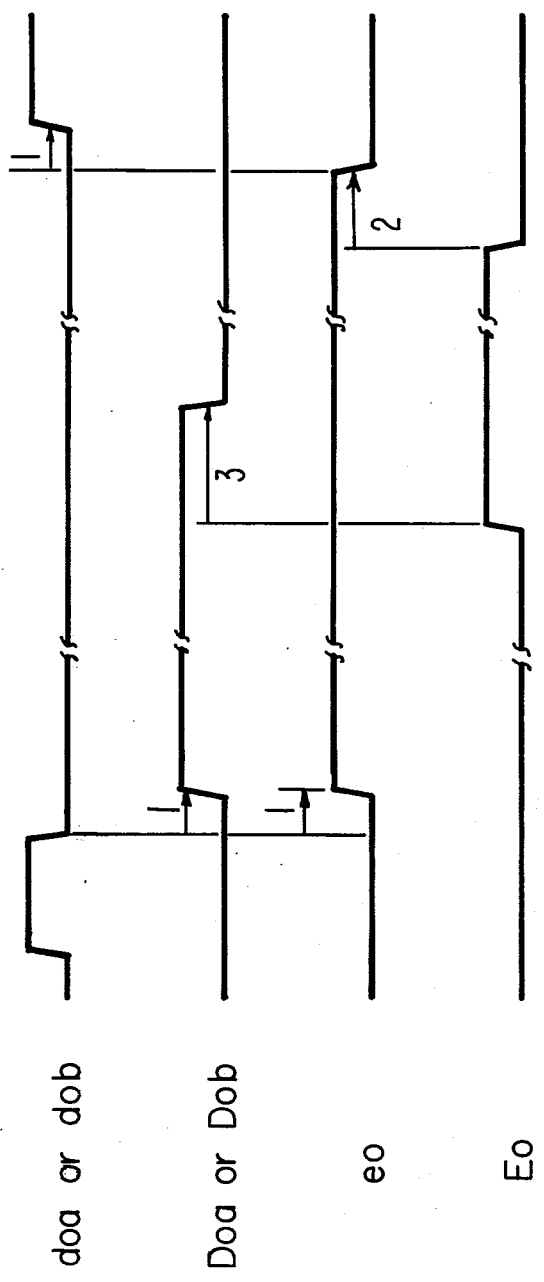
FIG. 7 is a timing diagram of data transfer from the last cell to the output circuit as shown in FIG. 6.
Figure 10:
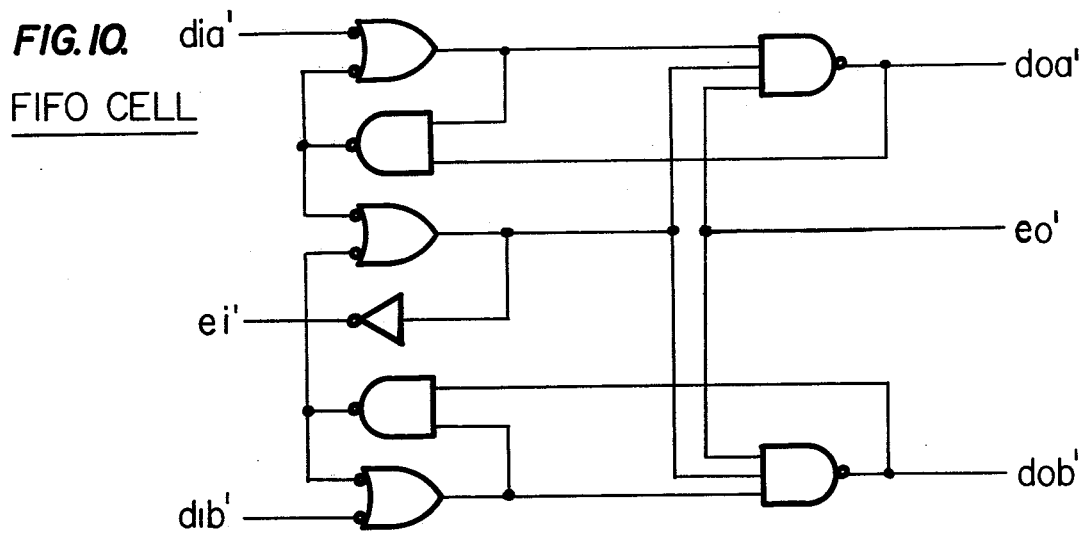
FIG. 10 is a schematic diagram showing one embodiment of a cell which can be utilized in the system shown in FIG. 8.
Figure 11:
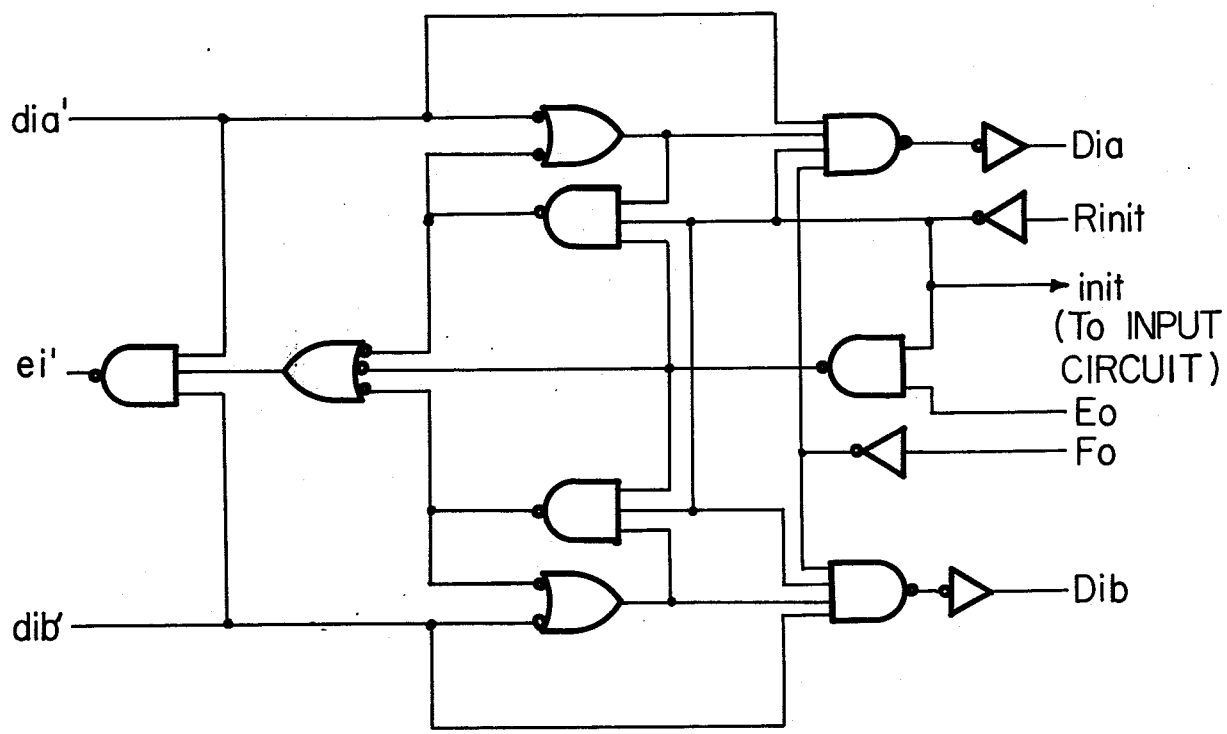
FIG. 11 is a schematic diagram showing one embodiment of an output circuit which can be utilized in the system shown in FIG. 8.

FIG. 7 shows a timing diagram of the interaction just explained above between the last cell, Cell No. $n$, and the Output Circuit. The first section shows the transfer of data into the Output Circuit and then onto output line D$oa$ or D$ob$. The second section shows the clearing of D$oa$ or D$ob$ after E$o$ has changed to logical one. In the third section E$o$ returns to a logical zero level indicating that the external circuit is capable of receiving new data, and $eo$ from the Output Circuit returns to a logical zero level after two gate delays. If there is new data in either the upper or lower rail of the output Cell No. $n$, it can then be transferred into the Output Circuit via $doa$ or $dob$.

In view of the foregoing, it can now be realized that the asynchronous circuit of the present invention provides a means by which data is transferred asynchronously throughout the system. The Input Circuit will not accept data until there is room in the internal cells to receive the data. When one or more of the internal cells are empty, the data can be entered into the queue and shifted sequentially through a series of cascaded cells until the next cell in line is full. The Output Circuit interfaces with external logic and permits the data in the cells to be read on a first in first out basis. Means are provided in the asynchronous system to prevent data transfer from the Output Cell until the previous cell has been cleared. Internally, accurate data transmission is maintained by satisfying certain relative delay requirements between gates. The transfer of data through a cell is conditioned by the presence of data in the cell and not by extraneous timing circuits.

It should be understood that a plurality of queues as just described can be linked together to provide a queue of theoretically indefinite length. Several queues may also be used in parallel to meet a variety of applications. It is an important feature of this invention that the asynchronous system provides extremely high speeds. While known asynchronous systems have a frequency of operation generally about 1Mz or lower, the asynchronous system of the present invention is expected to provide a frequency of operation in the range between 5 to 20MHz. The speed of operation is dependent upon internal gate delay considerations and will increase as the semiconductor art provides gates with higher speeds.

FIGS. 8-11 show another example of this invention which is suitable for I²L integration using NAND gates as compared with the OR/NOR gate implementation of the previous example. The method of data transfer in the system shown in FIGS. 8-11 is substantially the same as described in detail in connection with the example shown in FIGS. 1-7. Consequently, further description of the operation of the system of FIGS. 8-11 is deemed to be unnecessary. The external connections D$ia$, E$i$, D$ib$, D$oa$, E$o$ and D$ob$ are the same as in the previous example except for F$o$ and R$init$ which have been included for additional features. F$o$ causes the output data to clear but not be deleted so that the next access gives the same data. R$init$ empties the queue when held at a logical one for a sufficient length of time.

Therefore, while this invention has been described in connection with certain examples thereof, no limitation is intended thereby except as defined in the appended claims.

What is claimed is:

1. In an asynchronous system having a plurality of asynchronous cells in series, each cell for the system comprising:
   first and second latch means for storing binary data;
   a data presence gate having input means and output means for producing an output signal indicative of data stored in either of said first and second latch means, said first and second latch means being coupled to said input means of said data presence gate;
   first and second transfer gate means each having input means for transferring data from said first and second latch means to a corresponding one of said first and second latch means of a subsequent cell;
   said first latch means, said output means of said data presence gate of the cell, and the output means of a data presence gate from a subsequent cell being coupled to said input means of said first transfer gate means;
   said second latch means, said output means of said a data presence gate of the cell, and the output means of a data presence gate from a subsequent cell being coupled to said input means of said second transfer gate means;
   whereby data can be transferred to a subsequent cell when there is data stored in either of said first and second latch means of the cell and the signal from the data presence gate of a subsequent cell indicates that it is capable of receiving new data; and
   means coupled between the output means of each of said transfer gate means and the respective latch means for clearing the respective latch means upon data transferal to the subsequent cell.

2. The asynchronous system of claim 1 which further includes an input circuit coupled between the first of said cells and an external data source, said input circuit comprising:
   two data input lines for receiving data from the external data source;
   a transfer gate means for each data input line coupled to one of said latch means in said first of said cells, said transfer gate means for transferring data into its corresponding latch means when the signal from the cell data presence gate indicates that the cell is capable of receiving new data; and
   means providing a feedback signal to the external data source to inhibit data transferal into the input circuit until the first cell is capable of receiving new data.

3. The asynchronous system of claim 1 which further includes an output circuit coupled between the last cell of said cells and external circuitry, said output circuit comprising:
   first and second latch means coupled to the first and second transfer gate means in said last cell, said respective latch means in the output circuit for storing data received from the latch means of said last cell through said transfer gate means in said last cell;
   a transfer gate means coupled to each of the output circuit latch means for transferring data to external circuitry; and
   means for inhibiting data transfer to the external circuitry until the data in said last cell has been cleared.

4. In an asynchronous system having a plurality of asynchronous cells in series, each cell for the system comprising:
   first and second latch means for storing binary data, each of said latch means having a first gate cross coupled with a second gate, each gate having output means, said first and second gates of each latch means having input means for receiving said data;
   a data presence gate having input means and a negated and non-negated output, said output means of said second gate of both of said latch means being coupled to said input means of said data presence gate; and
   first and second transfer gate means each having input means and output means for transferring data from said first and second latch means, respectively, to a subsequent cell;
   said output means of the first gates in said latch means being coupled to the input means of their respective transfer gate means, one of the outputs of said data presence gate being coupled to the input means of both of said transfer gate means, and one of the outputs of the data presence gate of a subsequent cell being coupled to the input means of both of said transfer gate means;

the other input of said data presence gate of the cell providing a feedback signal to a previous cell indicative of data stored in either of said latch means;

the output means of both of said transfer gate means being coupled to said input means of the second gate in their respective latch means;

whereby data stored in either of said latch means is sequentially transferred to a subsequent cell through its respective transfer gate means upon receiving a signal from the data presence gate of said subsequent cell indicating that it is capable of receiving new data; and whereby said latch means are cleared by the output signal of said transfer gate means so that the cell can receive new data after the data has been transferred to the subsequent cell.

5. The asynchronous system of claim 4 which further includes an input circuit coupled between the first of said cells and an external data source, said input circuit comprising:

two data input lines for receiving data from the external data source;

a first transfer gate means coupled between one of said data input lines and the first gate in the first latch means of the first of said cells;

a second transfer gate means coupled between the other data input line and the first gate in the second latch means of the first of said cells;

the data presence gate of the first of said cells being coupled to the input means of said first and second transfer gate means to supply a feedback signal thereby permitting data transferal from the transfer gate means of said input circuit into the respective latch means only when there is no data stored in either of said latch means; and means coupled between said data presence gate and the external data source for inhibiting further data transferal onto the data input lines of the input circuit until there is no data stored in the respective latch means of said first cell.

6. The asynchronous circuit of claim 4 which further includes an output circuit coupled between the last of said cells and external circuitry, said output circuit comprising:

first and second latch means for storing data received from said latch cell, each latch means having a first gate cross coupled with a second gate, each gate having input means and output means, the input means of the first gate of each latch means being coupled to the output means of its respective transfer gate means of the last cell;

first and second transfer gate means each having input means and output means for transferring data from said first and second latch means, respectively, to the external circuitry;

the output means of the first gates in said first and second latch means being coupled to the input means of their respective transfer gate means, and the output means of the transfer gate means of the last cell being coupled to the input means of their corresponding transfer gate means in the output circuit;

the input means of the second gates in both of said first and second latch means being coupled to a signal line from the external circuitry indicating whether or not it is capable of reading data stored in the output circuit; and feedback signal means for providing a feedback signal to the input means of the transfer gate means of the last cell;

said signal line from the external circuitry, the output means of the second gates in the first and second latch means, and the output means of the last cell transfer gate means being coupled to said feedback signal means;

whereby data is transferred to the external circuitry from the output circuit if the signal from said external circuitry indicates it is capable of reading new data but not until data has been cleared from the last cell by the feedback signal of the output circuit.

* * * * *